United States Patent
Trammell et al.

(10) Patent No.: US 6,347,288 B1
(45) Date of Patent: Feb. 12, 2002

(54) AUTOMATIC POLE-ZERO ADJUSTMENT CIRCUIT FOR AN IONIZING RADIATION SPECTROSCOPY SYSTEM AND METHOD

(75) Inventors: Rex C. Trammell, Andersonville; Russell D. Bingham, Knoxville; Dale A. Gedcke, Oak Ridge, all of TN (US)

(73) Assignee: PerkinElmer Instruments, Knoxville, TN (US)

( * ) Notice: Subject to any disclaimer, the term of this patent is extended or adjusted under 35 U.S.C. 154(b) by 0 days.

(21) Appl. No.: 09/437,857

(22) Filed: Nov. 10, 1999

Related U.S. Application Data

(63) Continuation of application No. 09/388,094, filed on Sep. 1, 1999, now Pat. No. 6,295,508.

(51) Int. Cl.$^7$ .............................................. H03H 17/00
(52) U.S. Cl. ........................ 702/107; 702/106; 702/69; 250/336.1; 250/370.01; 330/305
(58) Field of Search ............................ 702/107, 22, 27, 702/28, 30–32, 106, 57, 66, 67, 69–71, 73, 74, 78–80, 89, 117, 118, 124–126, 179, 180, 183, 187, 189–191, 193–195, 197, 198, FOR 103, FOR 104, FOR 110, FOR 134, FOR 139, FOR 140, FOR 156, FOR 157, FOR 159, FOR 162, FOR 164, FOR 166, FOR 170, FOR 171; 324/601, 620, 76.14, 76.19; 330/2, 305; 378/91, 53; 250/363.01, 363.05, 363.07–303.09, 370.06, 369, 370.01, 389, 252.1 R, 252.1 A, 390.07, 395, 339.06, 339.07, 339.09, 341.5

(56) References Cited

U.S. PATENT DOCUMENTS

| 4,491,799 A | * | 1/1985 | Giardinelli ..................... 330/2 |
| 5,821,533 A | * | 10/1998 | Bingham et al. ..... 250/252.1 R |
| 5,872,363 A | | 2/1999 | Bingham et al. ...... 250/363.01 |
| 5,912,825 A | * | 6/1999 | Bingham .................... 330/305 |
| 4,866,400 C1 | | 8/1999 | Britton, Jr. et al. ......... 330/305 |

OTHER PUBLICATIONS

C.H. Nowlin, et al.—Elimination of Undesirable Undershoot in the Operation and Testing of Nuclear Pulse Amplifiers *The Review of Scientific Instruments*, vol. 36, No. 12, Dec. 1965.

* cited by examiner

Primary Examiner—Hal Wachsman
(74) Attorney, Agent, or Firm—Pitts & Brittian, P.C.

(57) ABSTRACT

An automatic pole-zero (APZ) adjustment circuit for an ionizing radiation spectroscopy system. An output of a preamplifier is sampled to identify the decay time constant of the preamplifier output. A correction based upon the identified decay time constant is generated by a correction signal generator and applied through either an analog pole-zero adjustment network or a programmable digital shaping filter to accomplish pole-zero correction.

18 Claims, 8 Drawing Sheets

AUTOMATIC POLE-ZERO ADJUSTMENT CIRCUIT FOR AN IONIZING RADIATION SPECTROSCOPY SYSTEM AND METHOD

CROSS-REFERENCE TO RELATED APPLICATIONS

This application is a continuation of U.S. patent application Ser. No. 09/388,094 filed on Sep. 1, 1999, now U.S. Pat. No. 6,295,508.

STATEMENT REGARDING FEDERALLY SPONSORED RESEARCH OR DEVELOPMENT

Not Applicable.

BACKGROUND OF THE INVENTION

1. Field of Invention

This invention relates to an automatic pole-zero adjustment circuit for an ionizing radiation spectroscopy system. Specifically, this invention relates to a circuit for an ionizing radiation spectroscopy system which automatically adjusts the pole-zero based upon the time constant of the output of the preamplifier.

2. Description of the Related Art

Semiconductor radiation detectors are commonly used to measure the characteristics of ionizing radiation. Typical examples of such radiation are X-rays, gamma rays and charged particles such as alpha particles. The detector measures the energy of single photons or particles. Often it is the case that the characteristic of interest is the energy spectrum. The spectrum is a chart or histogram of the number of events occurring as a function of energy. Discrete energies show up as peaks in the spectrum. If the detector system has good energy resolution, then the peaks will be narrow and closely adjacent energies can be distinguished.

When the detector absorbs the energy of the photon or the charged particle, free electronic charge is produced inside the detector. The charge produced is accurately proportional to the energy absorbed. Typically, the signal current produced by the collection of the free charge is integrated on the feedback capacitor of a preamplifier. The output voltage of the preamplifier is thus equal to the charge divided by the feedback capacitor and is used as a measure of the energy of the ionizing radiation. If the voltage is measured for many events and charted as the number of events versus voltage, then the characteristic energy spectrum of the radiation is obtained.

Unless some means is provided to remove charge from the feedback capacitor, the output voltage will soon reach limits imposed by the circuit and the system will cease to function. The most common solution to this problem is to place a feedback resistor in parallel with the capacitor. The preamplifier output then consists of voltage steps proportional to the energy of individual energy absorption events, separated by exponential decays having a time constant equal to the product of the feedback resistance and the feedback capacitance. In order to maintain the excellent signal-to-noise ratio inherent in the detector, the resistance must be large. Typical time constants are in the millisecond range.

For optimum energy resolution and high data rates, the pulse from the preamplifier must be filtered and amplified. The filter amplifier changes the shape of the output to a pulse with a longer rise time and shorter decay time than the preamplifier pulse. The maximum amplitude of the filtered pulse is still proportional to the absorbed energy. Measurement of the pulse amplitude relative to the baseline between pulses gives the best estimate of the energy. Clearly, the baseline must be constant and stable to at least the same accuracy as the energy measurement.

The first stage of the filter amplifier is typically a high-pass filter. The high-pass filter removes low frequency noise and shortens the width of the pulse. If the exponentially decaying preamplifier pulse is passed through a simple capacitor/resistor high-pass filter, then the resulting output is an exponential decay having the time constant of the high-pass filter followed by an undershoot having the original preamplifier decay time constant. This undershoot is very undesirable. The amplitude of subsequent pulses is reduced by the amount of the residual undershoot, when it occurs, making the results inaccurate. Unless the data rates are kept unreasonably low, the result will be distortion of the individual peaks in the energy spectrum.

A technique to eliminate the undershoot was disclosed by Nowlin, et al., in an article entitled "Elimination of Undesirable Undershoot in the Operation and Testing of Nuclear Pulse Amplifiers," Rev. Sci. Instr., Vol. 36, No. 12, Dec. 1965, pp 1830–1839, the contents of which are fully incorporated here by reference. In Laplace transform terms, the preamplifier decay time constant, or pole, is canceled by a zero in the high-pass filter that coincides with the pole in the complex frequency or "s" plane. Nowlin's method, commonly known as pole-zero cancellation, performs well, but requires added equipment and a skilled operator to correctly adjust. The pole-zero cancellation is considered complete when the operator, using an oscilloscope or other indicator, observes minimum under/overshoot of the pulses.

If the entire system of detector, preamplifier, and filter amplifier were assembled by the same manufacturer at the same time, the pole-zero adjustment would be performed at the manufacturing site, using optimum equipment, and thus would cause no problems for the end user. Often, however, the detector and preamplifier are assembled as a unit and the filter amplifier and other electronic components of the spectroscopy system are assembled separately, perhaps by a different manufacturer. The user may wish to upgrade either the detector or the electronics at some later date. Because of these factors, it is necessary that the pole-zero cancellation be possible for an arbitrary combination of a detector/preamplifier unit and a filter amplifier.

Typically, the preamplifier contains a high-pass filter to replace the original long time constant pole with some shorter value pole, for example, 50 microseconds. The pole-zero cancellation required at this stage is done by the manufacturer and normally never changed. The typical value used is longer than that required for optimal performance so the filter amplifier must still contain a high-pass filter and a pole-zero cancellation circuit to cancel the preamplifier's output pole.

Britton, et al., described a method mathematically equivalent to the Nowlin method, but performed automatically, in U.S. Pat. No. 4,866,400, fully incorporated herein by reference. Britton, et al., teach monitoring the under/overshoot of the pulses from the analog filter amplifier to control the pole-zero cancellation network in the high-pass filter. The pole-zero cancellation is considered complete when minimum under/overshoot is observed.

Bingham, et al., in U.S. Pat. No. 5,872,363, fully incorporated herein by reference, describe a method similar to the Britton, et al., method except applicable to the case wherein some or all of the high-pass and subsequent filtering are done digitally. After converting the signal to digital form, using an analog-to-digital converter, the pulses are filtered using digital signal processing techniques. Incorrect pole-zero cancellation causes under/overshoot of the digital pulses resulting in spectrum distortion similar to that in the analog system. Bingham, et al., teach monitoring the under/overshoot of the digital pulses to control the pole-zero cancellation in either an analog high-pass or all digital filter. The pole-zero cancellation is considered complete when minimum under/overshoot is observed.

Another method is to monitor the shape of the peaks in the spectrum to control the pole-zero cancellation in either an analog high-pass filter or a digital filter. The pole-zero cancellation is considered complete when minimum spectral peak distortion caused by under/overshoot is observed.

All of the above techniques can be described as closed-loop or feedback controllers. The output of the system, either the under/overshoot of the filtered pulses or the resulting spectral peak distortion, is used to generate a suitable control signal to adjust the pole-zero adjustment circuit. The pole-zero adjustment process is repeated until an acceptable result is achieved. After adjustment, the parameters of the pole-zero adjustment circuit are left constant for subsequent data collection.

Pole-zero adjustment can also be accomplished by an open-loop system without using feedback. Open-loop systems are typically simple to design and inexpensive but not as accurate as closed-loop systems. If the preamplifier decay time constant (the pole) of the input to the pole-zero cancellation circuit is accurately known, then the pole-zero adjustment is simply performed by setting the zero of the pole-zero circuit to coincide with the input pole. If the pole-zero cancellation circuit is programmable, then the adjustment can be done easily in a computer-controlled system, requiring little or no skill on the part of the operator. If the pole-zero cancellation network is precise and stable, then the results can approach that of the closed loop systems.

It is an object of this invention to provide open-loop automatic pole-zero cancellation circuits and methods that are simpler than the closed-loop methods of the prior art but provide essentially equal performance. It is a further object to provide open-loop automatic pole-zero cancellation circuits and methods such that automatic pole-zero cancellation for arbitrary combinations of detector/preamplifier units and filter amplifiers can be used with little or no operator input.

BRIEF SUMMARY OF THE INVENTION

An automatic pole-zero (APZ) adjustment circuit for an ionizing radiation spectroscopy system is provided. The detected radiation emissions are fed into a preamplifier with a conventional parallel RC feedback circuit and passed to a high pass filter. The high pass filter improves the signal-to-noise ratio but the exponentially decaying input of the high pass filter results in undershoot. Undershoot is canceled by adding a correction signal generated by a pole-zero adjustment network. The correction signal is selected to algebraically cancel the undershoot when summed with the output signal of the high pass filter.

The high pass filter output and the pole-zero adjustment signal are summed and passed to the input of a sampling analog to-digital converter (ADC). Typically, these signals are currents and the summing is performed by a summing amplifier. The sampling ADC samples and converts the combined signals to a digital signal. The digital signal passes through a digital shaping filter that improves the precision of the energy measurement by removing higher, frequencies thereby improving the signal-to-noise ratio and minimizing the effects due to variable rise times and baseline errors. The digital shaping filter results in a pulse which has a longer rise time but still represents the energy of the detected emission.

A pulse amplitude sampling circuit samples the peak amplitude of each pulse output from the digital shaping filter. A histogram containing the number of pulses at each different voltage level is recorded by an amplitude histogram circuit. The histogram, which displays one or more peaks identifying the nature of the radiant emission detected, may be viewed in a display.

A sampling ADC samples the preamplifier output under the control of a processing device, typically a microprocessor. The processing device uses averaging and fitting techniques to calculate the exact preamplifier decay time constant. Using the calculated preamplifier decay time constant and the known characteristics of the pole-zero adjustment network, the processing device derives the correct pole-zero adjustment network control input. The correction signal from the pole-zero adjustment network is combined with the output of the high-pass filter to produce the pole-zero canceled signal. A balanced pole-zero network results in a peak having minimum distortion as evidenced by a peak having a minimum width and a near Gaussian distribution, while an unbalanced pole-zero network results in an asymmetric bell-shaped distribution showing low side distortion (undershoot) or high side distortion (overshoot).

In an alternate embodiment of the automatic pole-zero circuit, the high pass filter, the pole-zero adjustment network, and the summing amplifier are eliminated and the compensation is accomplished directly in a programmable digital shaping filter which transforms the exponential pulse shape by applying a digital filter using the calculated time constant of the preamplifier to correct the signal.

BRIEF DESCRIPTION OF THE SEVERAL VIEWS OF THE DRAWINGS

The above-mentioned features of the invention will become more clearly understood from the following detailed description of the invention read together with the drawings in which.

DETAILED DESCRIPTION OF THE INVENTION

Figure 1:
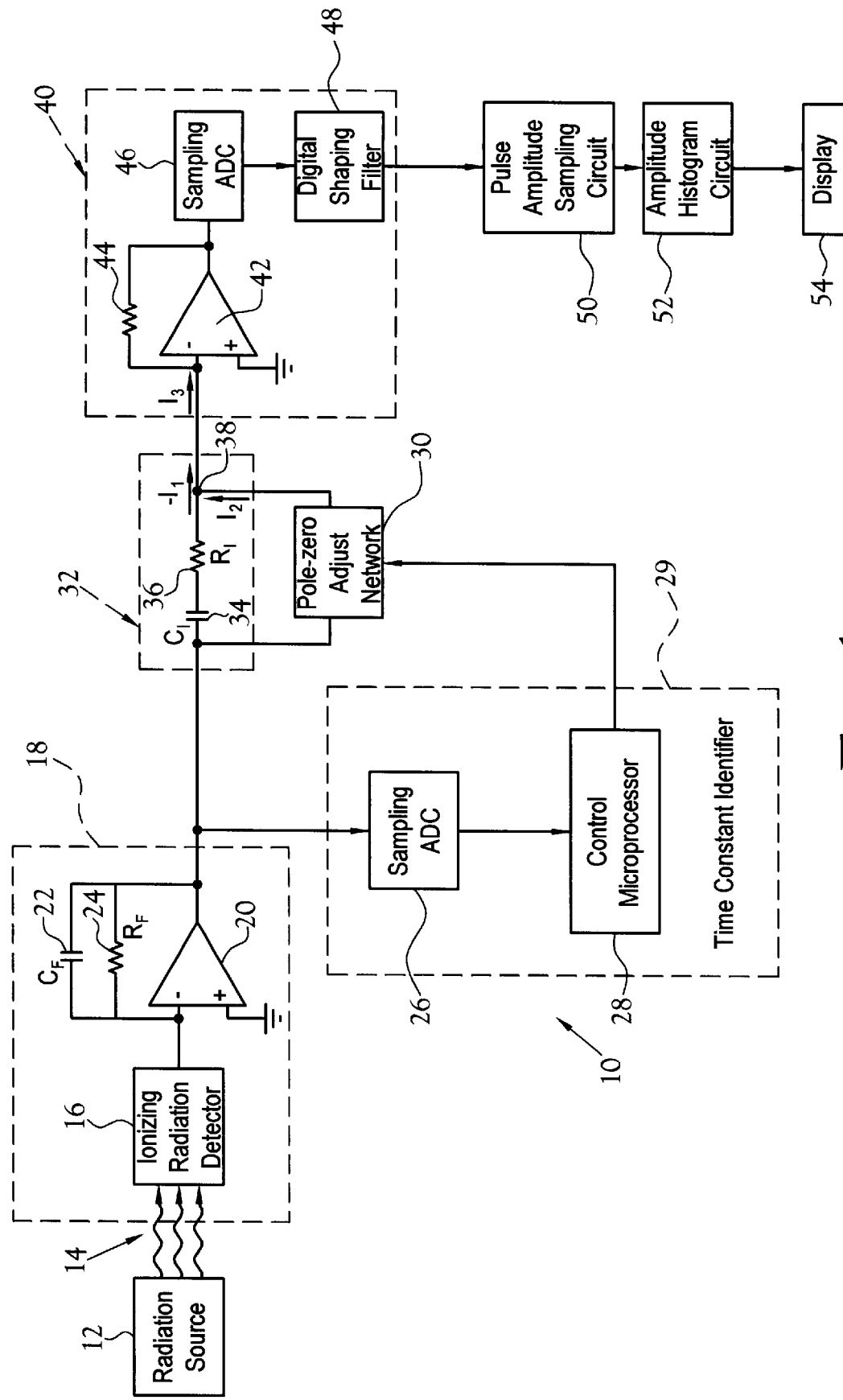
FIG. 1 is a schematic block diagram of an automatic pole-zero adjustment circuit for an ionizing radiation spectroscopy system according to this invention.

There is shown in FIG. 1 an ionizing radiation spectroscopy system having an automatic pole-zero (APZ) adjustment circuit 10 according to this invention including a source 12 of radiation such as alpha or gamma rays. The energy of the radiation 14 is absorbed by an ionizing radiation detector 16 and converted to a charge, producing a signal that is submitted to a preamplifier 20. Together the preamplifier 20 and the detector 16 form the detector unit 18. The preamplifier 20 has a feedback network including a capacitor, $C_F$, 22 and a resistor, $R_F$, 24 connected in parallel. The output from the preamplifier 20 is delivered to a high pass filter 32 which includes a capacitor, $C_f$, 34 and a resistor, $R_f$, 36 connected in series.

The high pass filter 32 improves the signal-to-noise ratio by eliminating low frequencies, makes room for analyzing succeeding pulses by bringing each pulse to baseline as quickly as possible so as to avoid interference with the next pulse, and minimizes the DC offset resulting from pulse pile-up at high repetition rates while allowing greater amplification of the signal. The high pass filter 32 provides an exponential decay for a step pulse, but because the voltage supplied to the input of the high pass filter 32 is actually a decaying voltage, the exponentially decaying output of the high pass filter 32 tends to be a decaying waveform with undershoot.

To minimize the effect of undershoot resulting from the high pass filter 32, the spectroscopy system 10 is pole-zero calibrated. Calibration is effected by sampling the output of the preamplifier 20 using a sampling analog-to-digital converter (ADC) 26. During the calibration process, a processing device 28 monitors the sampling ADC 26 and calculates the time constant of the preamplifier output using the sampled signal. In the illustrated embodiment, the sampling ADC 26 and the processing device 28 form a time-constant identifier 29. In one embodiment, the processing device 28 is implemented with a microprocessor, such as an Intel 1386. The sampling ADC 26, controlled by the processing device 28, samples the output of the preamplifier 20. The processing device 28 uses averaging and filtering techniques known to those skilled in the art on the sampled output to calculate the exact preamplifier decay time constant. Using the calculated preamplifier decay time constant and the known characteristics of the pole-zero adjustment network 30, the processing device 28 derives a control signal calculated to properly compensate the preamplifier output. The control signal is applied through the pole-zero adjustment network 30. One skilled in the art will recognize that other methods of selecting the control signal may be used, including selecting a control signal based upon the calculated preamplifier decay time constant from correction data stored in a look-up table (not shown).

Figure 7:
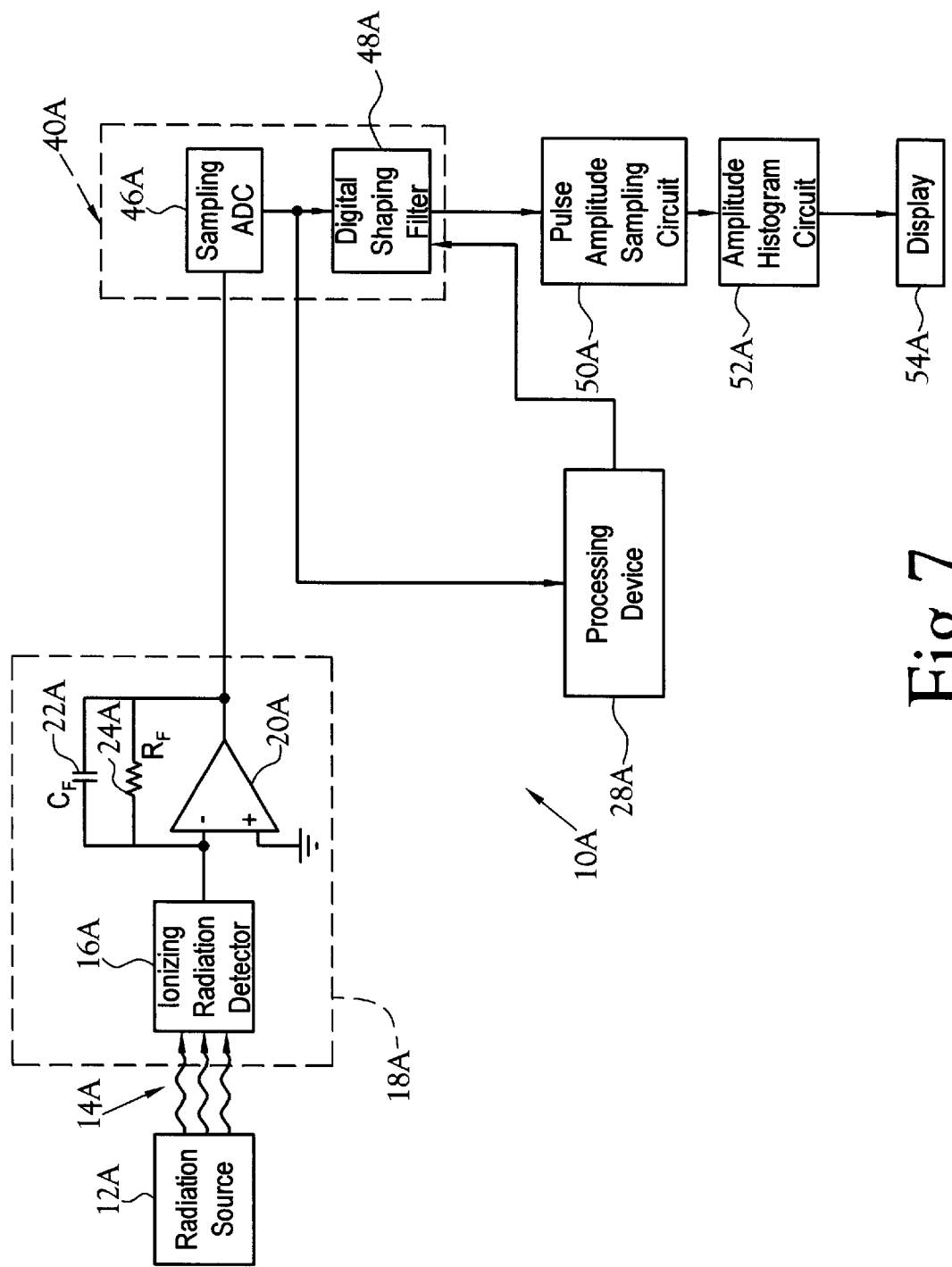
FIG. 7 is a schematic block diagram of an alternate embodiment of the automatic pole-zero adjustment circuit according to this invention.

The digital control signal is received by a pole-zero adjustment network 30. The pole-zero adjustment network 30 converts the digital correction signal to an analog correction signal, $I_2$, and sums the analog correction signal with the output signal, $I_1$, of the high pass filter 32 at node 38. One skilled in the art will recognize that the pole-zero adjustment network 30 can be implemented using various methods, for example, a simple adjustable resistor, such as a potentiometer, driven by a stepping motor or a more sophisticated system such as that shown in U.S. Pat. No. 4,866,400 the ('400 patent). The preferred embodiment of the pole-zero adjustment network 30 includes a number of amplifiers and a multiplying digital-to-analog converter as shown in FIG. 7 of the '400 patent.

The combined signal at node 38 is passed to a digital conversion circuit 40 and converted to a voltage by a summing amplifier 42 and its feedback resistor 44. A sampling ADC 46 samples and converts the amplified analog signal to a digital signal. In the preferred embodiment, the sampling ADC 46 samples the signal approximately every 50 nanoseconds. The digital signal passes through a digital shaping filter 48 that improves the precision of the energy measurement by improving the signal-to-noise ratio and minimizing the effects due to variable rise times and baseline errors. The digital shaping filter 48 results in a pulse which has a longer rise time but still represents the energy of the detected emission.

A pulse amplitude sampling circuit 50 samples the peak amplitude of each pulse output from the digital shaping filter 48. A histogram containing the number of pulses at each different voltage level is recorded by an amplitude histogram circuit 52. The histogram, which displays one or more peaks identifying the nature of the radiant emission detected, may be viewed using a display 54.

Figure 2:
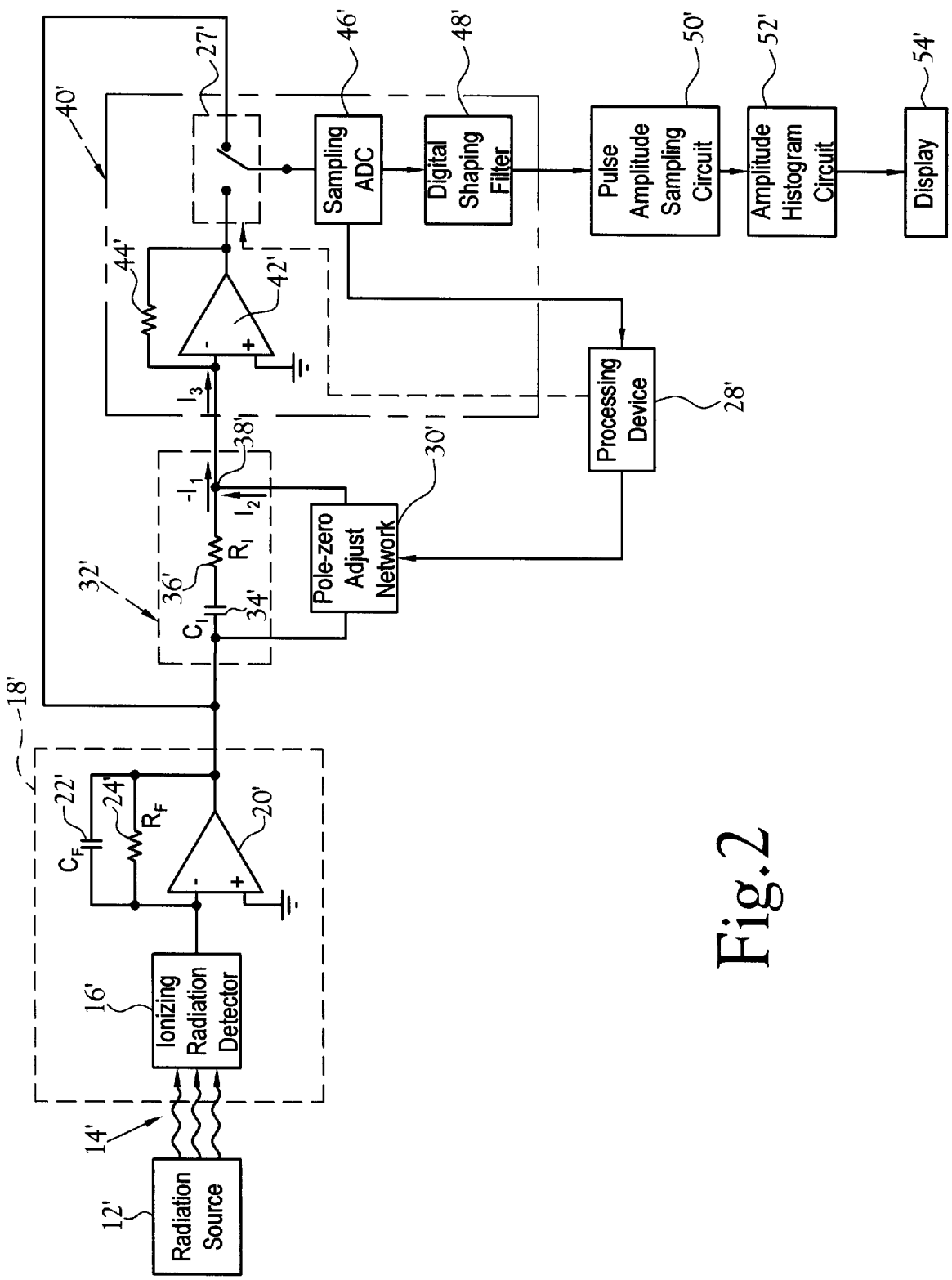
FIG. 2 is a schematic block diagram of an alternate embodiment of the automatic pole-zero adjustment circuit of FIG. 1.

FIG. 2 illustrates an alternate embodiment of the spectroscopy system 10'. One skilled in the art will recognize that a single sampling ADC 46' can be used in place of the sampling ADC 26 and the sampling ADC 46. A switch 27' selects the input to the sampling ADC 46'. One skilled in the art will recognize that the switch 27' can be a manual switch which must be physically toggled by the operator or a switch controlled by the processing device 28' via external software. When the calibration process is initiated, the switch 27' diverts the output of the preamplifier 20' to the sampling ADC 46' thereby allowing the time constant of the preamplifier to be sampled and identified. Once the calibration process is complete, the switch 27' diverts the output of the summing amplifier 42' to the sampling ADC 46' thereby allowing the conditioned signal acquired at the detector 16' to be sampled and digitized.

Figure 3:
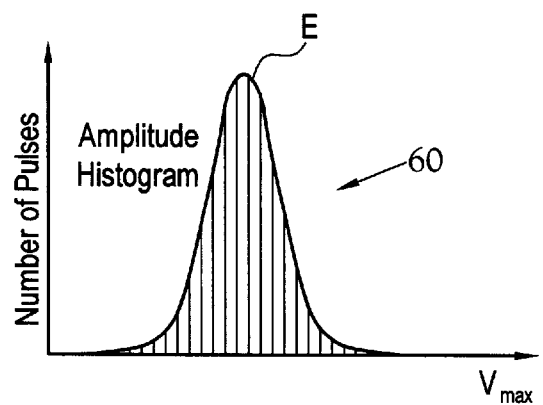
FIG. 3 depicts an amplitude histogram recorded by the present invention of FIG. 1 correctly compensated such that it evidences no undershoot or overshoot.
Figure 4:
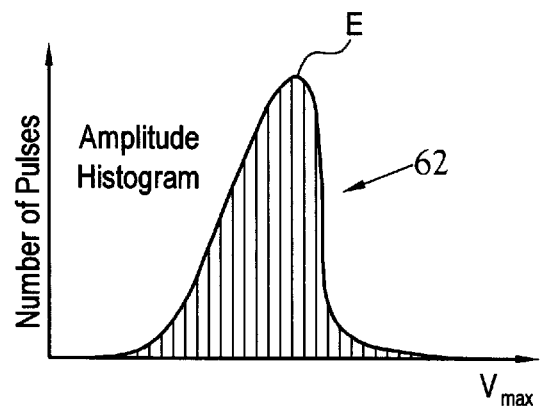
FIG. 4 depicts an amplitude histogram recorded by the present invention of FIG. 1 evidencing undershoot.
Figure 5:
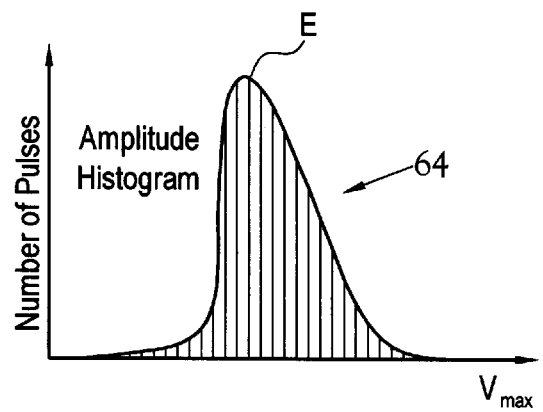
FIG. 5 depicts an amplitude histogram recorded by the present invention of FIG. 1 evidencing overshoot.

FIG. 3 shows a histogram in which the number of pulses is charted against the voltage of the pulses as generated by the amplitude histogram circuit 52. The peak pulse voltage, E, is used to identify the particular radiant emission and the corresponding emission source. One skilled in the art will recognize that while FIG. 3 illustrates only a single peak of the histogram 60, a typical spectrum would include a number of such peaks which identify a particular radiation source. The histogram 60 of FIG. 3 has minimum distribution as evidenced by the minimum width and near Gaussian distribution which indicates that the over/undershoot has been properly canceled. However, when undershoot is present, the amplitude sampled by the pulse amplitude sampling circuit 50 is reduced by the magnitude of the undershoot. FIG. 4 illustrates the unbalanced histogram 62 of a spectral peak having low side distortion resulting from the recording of a disproportionate number of low amplitude pulses caused by undershoot. Conversely, when overshoot is present, pulses having amplitudes increased by the magnitude of the overshoot are sampled by the pulse amplitude sampling circuit 50 resulting in the histogram 64 of FIG. 5 showing high side distortion.

Figure 6:
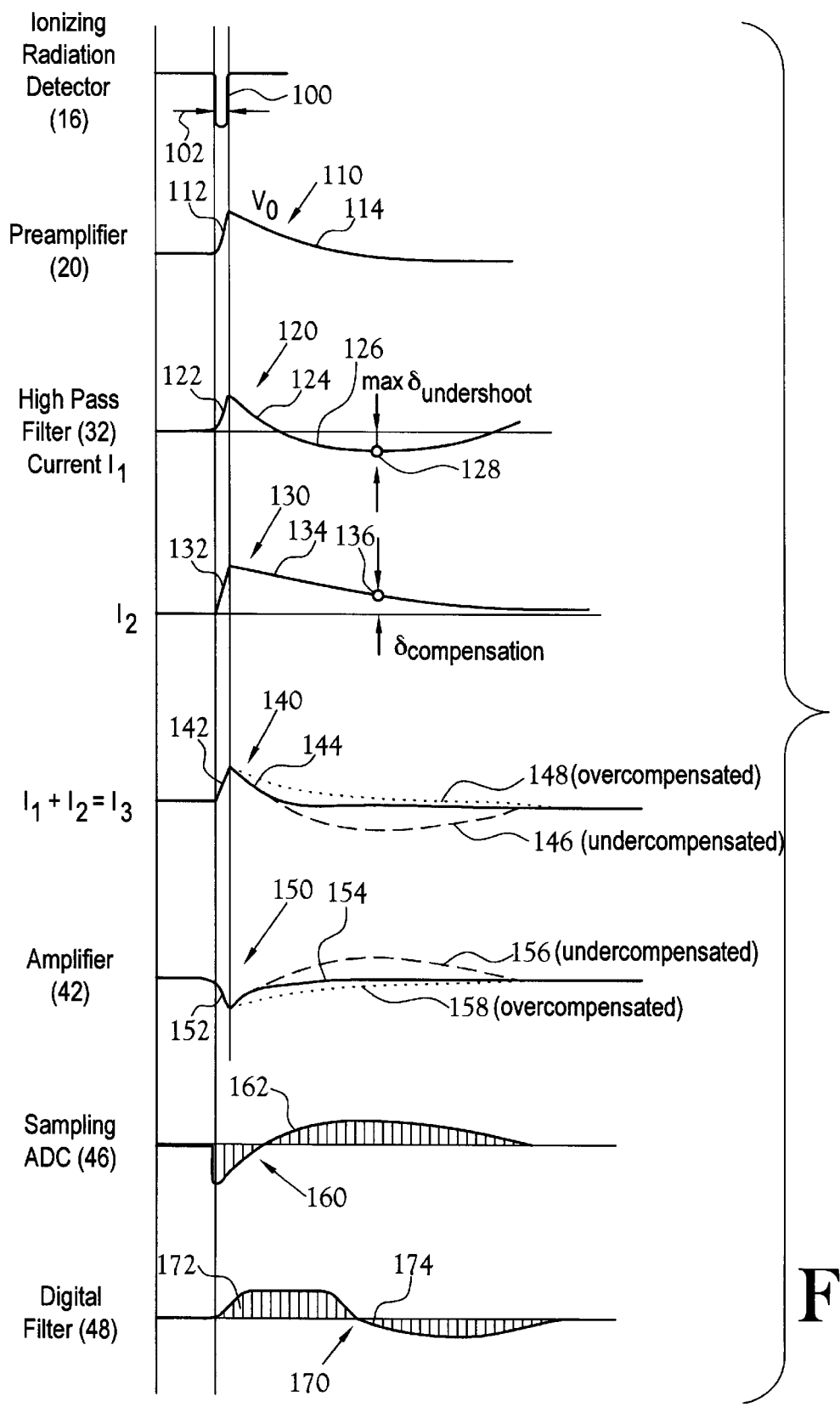
FIG. 6 depicts a series of waveforms which occur in the circuit of FIG. 1.

To aid in understanding, FIG. 6 illustrates the waveforms present at various points in the APZ adjustment circuit 10. At the output of ionizing radiation detector 16, the negative-going signal of the detected pulse 100 represents the charge generated by the incident radiation. The duration of the detected pulse, indicated at 102 and exaggerated for illustrative clarity, is extremely short, typically 0.1 to 0.6 microseconds. Upon passing through the preamplifier 20, the detected pulse 100 is converted to an amplified pulse 110.

The amplified pulse 110 has the same duration from the onset at the leading edge 112 to a peak voltage, $V_0$, followed by an exponential voltage decay 114 defined by the time constant of the preamplifier $\tau_{preamp} = R_F C_F$. At the output of the high pass filter 32, the filtered pulse 120 has a fast rise time from the leading edge 122 to a peak current, $I_0$. The decay along the trailing edge 124 is expressed as $$I_0 \left[ \frac{\tau_{preamp} e^{-t/R_1 C_1} - R_1 C_1 e^{-t/\tau_{preamp}}}{\tau_{preamp} - R_1 C_1} \right] \quad (1)$$

The desired time constant is $\tau_{desired} = R_1 C_1$. The trailing edge 124 shows the undershoot 126 having a maximum $\delta_{undershoot}$ at a point 128.

The correction signal, $I_2$, measured at node 38 appears in the form of a pulse 130 having a fast rise time along the leading edge 132 until reaching a peak current, $KI_0$, where $$K = \frac{\tau_{desired}}{\tau_{preamp} - \tau_{desired}} \quad (2)$$

Ideally, the exponential decay of the correction signal trailing edge 134 is calculated as $$KI_0 e^{-t/R_f C_f} \quad (3)$$

such that the value at a point 136 has the same magnitude as the point of maximum undershoot 128 in the high pass filter output signal 120.

Thus, when signals $I_1$ and $I_2$ are combined, the undershoot in the resulting compensated signal, $I_3$, 140 is canceled and the leading edge 142 shares the same rapid rise time as the previous pulses. The exponential decay of the compensated signal 140 is defined as $$K_2 I_0 e^{-t/R_1 C_1} \quad (4)$$

where $K_2 = 1 + K$. Accordingly, the compensated signal trailing edge 144 quickly declines to zero without undershooting the zero baseline (i.e., $\delta_{compensation} = \delta_{undershoot}$) Precise compensation is critical, as undercompensation results in a portion of the undershoot still being present as indicated by the dashed line 146 and overcompensation results in an undesirably long return to baseline (overshoot) as indicated by the dotted path 148. The amplifier 46 inverts the compensated pulse 140 as illustrated by an amplified pulse 150 having a leading edge 152 and a trailing edge 154 corresponding to those of the compensated pulse 140. The results of undercompensation 156 and overcompensation 158 are similarly illustrated.

The final two illustrated pulses are shown in an uncompensated state. The digitized output pulse 160 of the sampling ADC 46 is illustrated showing the effects of undershoot 162. The digitally filtered pulse 170 is shaped by the digital signal filter 48 and shows a slower rise time along the leading edge 172 resulting from the enhancement of the signal-to-noise ratio by the removal of the higher frequencies. Further, the digitally filtered pulse 170 becomes less sharp and more rounded and shows an undershoot 174. It is the digitally filtered pulse 170 which is sampled by the pulse amplitude sampling circuit 50 for sorting by the amplitude histogram circuit 52.

FIG. 7 illustrates an alternate embodiment of the automatic pole-zero (APZ) adjustment circuit 10A. In this embodiment, the high pass filter 32, the pole-zero adjustment network 30, and the summing amplifier 42 with feedback resistance 44 of FIG. 1 are eliminated and the compensation accomplished directly in a programmable digital shaping filter 48A. The sampling ADC 46A, controlled by the processing device 28A, samples the output of the preamplifier 20A. The processing device 28A uses averaging and filtering techniques known to those skilled in the art on the sampled output to calculate the exact preamplifier decay time constant. Using the calculated preamplifier decay time constant, the processing device 28A derives an adjustment to the digital filter calculated to properly compensate the preamplifier output. The adjusted digital filter is applied through the programmable digital shaping filter 48A which transforms the exponential pulse shape into the desired pulse shape thus eliminating the over/undershoot.

The pulse at the output of the sampling ADC 46A has an exponential decay whose Z-transform is described by $$\frac{1}{1 - e^{t'/\tau_{preamp}} Z^{-1}} \quad (5)$$

where t' is the sampling period of the sampling ADC 46A. The programmable digital shaping filter 48A transforms the pulse from the sampling ADC 46A into the desired output pulse shape by applying a digital filter of the form $$H(Z)(1 - e^{t'/\tau_{adj}} Z^{-1}) \quad (6)$$

where $H(z)$ is the Z-transform of the desired output pulse shape. The over/undershoot compensation is accomplished by adjusting $\tau_{adj}$ to match $\tau_{preamp}$. Accordingly, as the preamplifier time constant has already been calculated by the processing device 28A, the proper time constant adjustment for the digital filter, $\tau_{adj}$, is known and the signal can be properly compensated.

Figure 8:
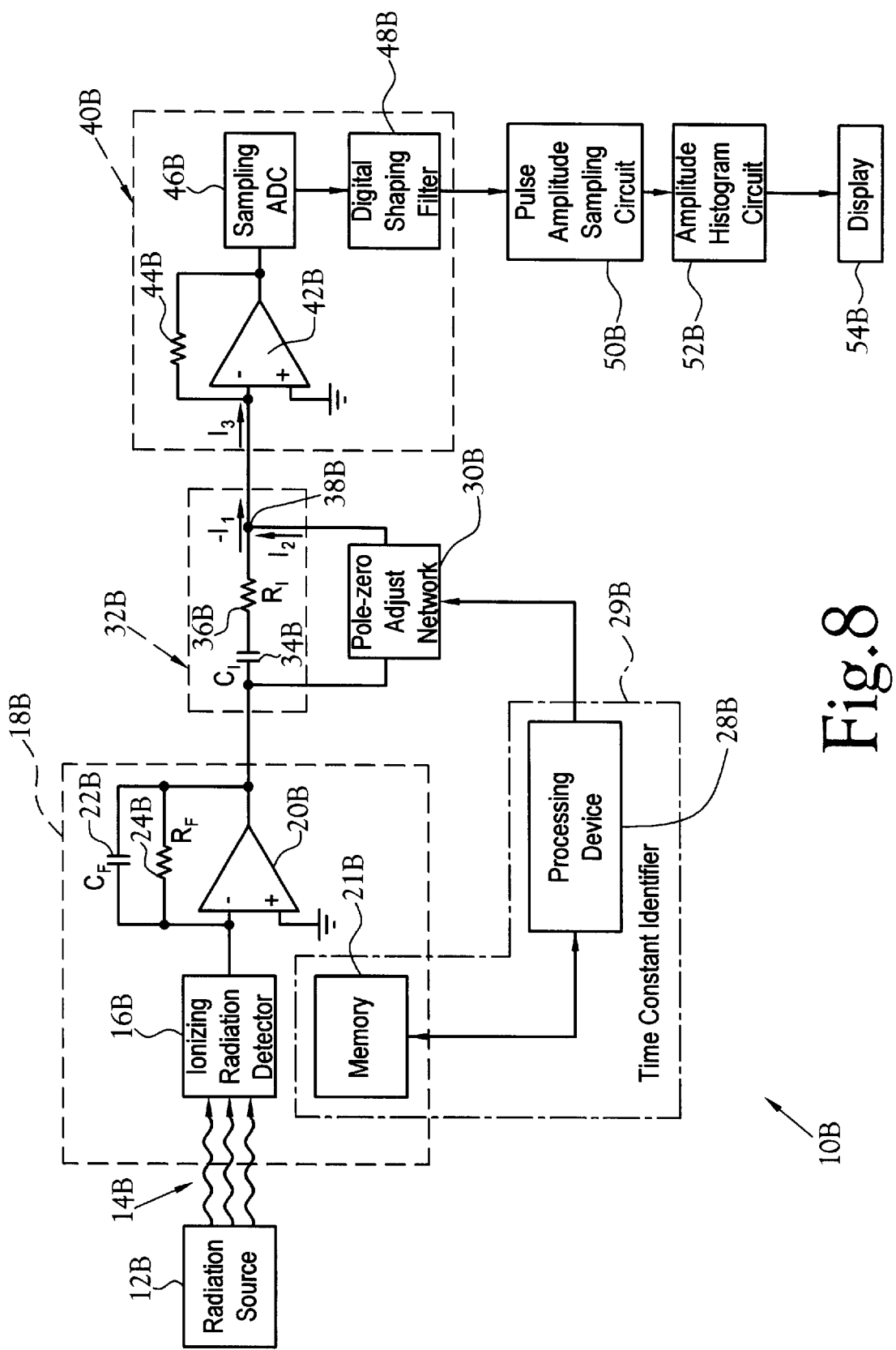
FIG. 8 is a schematic block diagram of an alternate embodiment of the automatic pole-zero circuit of FIG. 1.

In yet another embodiment, illustrated in FIG. 8, the sampling ADC 26 is removed and the detector unit 18B includes a static memory device 21B which contains information about the preamplifier 20B, including at least the precise preamplifier time constant. The preamplifier time constant is read directly by the processing device 28B and used to adjust the pole-zero of the circuit in any of the manners previously described. Together the memory device 21B and the processing device 28B form the time-constant identifier 29B. In the illustrated embodiment, the pole-zero of the circuit is adjusted using the pole-zero adjustment network 30B.

Figure 9:
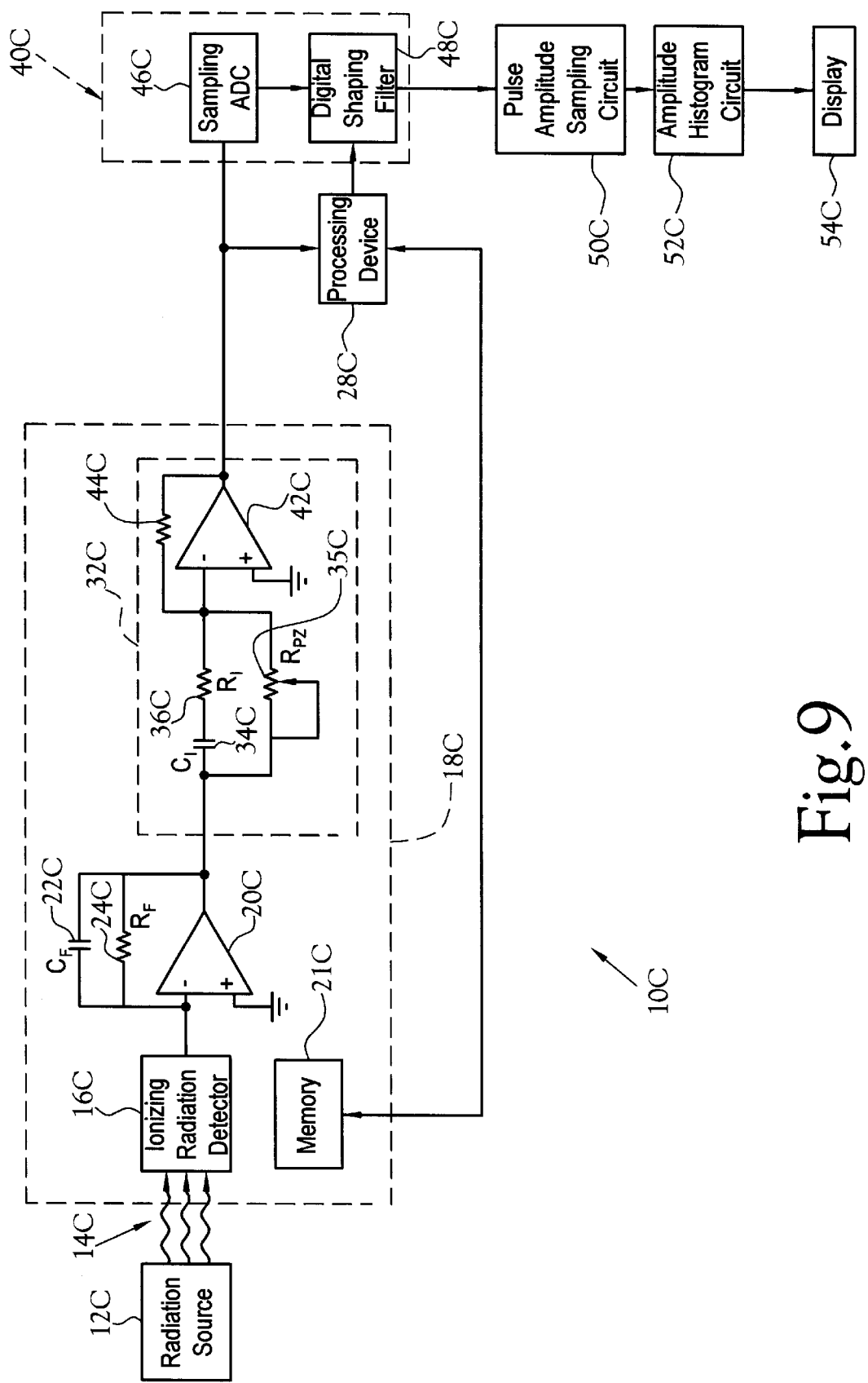
FIG. 9 is a schematic block diagram of a pole-zero adjustment circuit for an ionizing radiation spectroscopy system according to this invention.
Figure 10D:
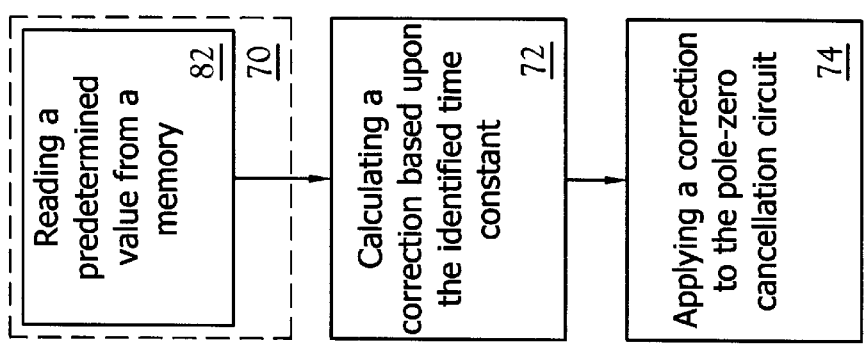
FIGS. 10a–10d are a flow chart of a method for automatically adjusting a pole-zero adjustment circuit of an ionizing radiation spectroscopy system.
Figure 10C:
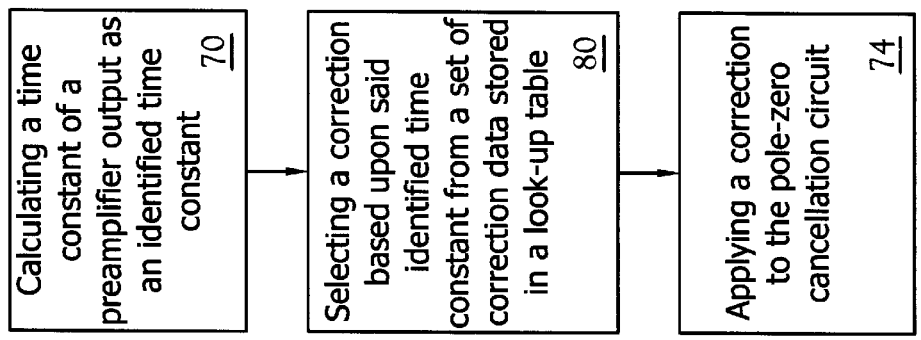
Figure 10B:
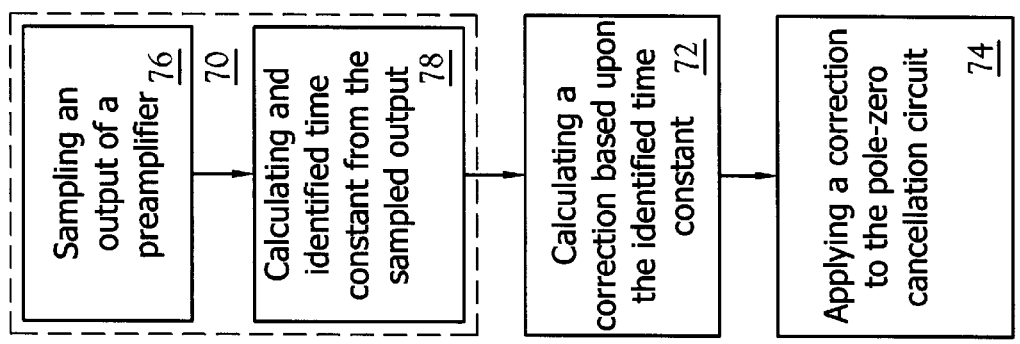
Figure 10A:
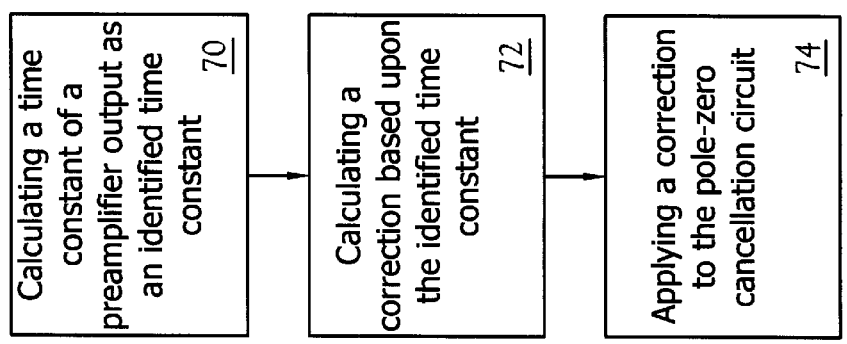

In a still further embodiment, a high pass filter 32C incorporating a filter amplifier 42C with a feedback resistor 44C is included in the detector unit 18C, as shown in FIG. 9, allowing the time constant of the preamplifier 20C to be matched with that of the high pass filter 32C by adjusting a variable resistor 35C. The decay time constant of the high pass filter 32C is selected to be short enough such that further high pass filtering is not required. This allows the output of the detector unit 18C to be calibrated by the manufacturer to have no undershoot or overshoot. A sampling ADC 46C, controlled by a processing device 28C, samples the output of the detector unit 18C. The processing device 28C uses averaging and filtering techniques known to those skilled in the art on the sampled output to calculate the exact preamplifier decay time constant. The exact preamplifier decay time constant is then used to make adjustments to the digital filter which is applied by the programmable digital shaping filter 48C to achieve the desired pulse shape. Accordingly, the detector unit 18C having the desired output characteristics can be selected without the need for pole-zero adjustment by the end-user. One skilled in the art will recognize a static memory device 21C which contains information about the preamplifier 20C, including at least the precise preamplifier time constant could be used as previously described.

FIGS. 10a–10d are flow diagrams of the method for automatically adjusting a pole-zero adjustment circuit of an ionizing radiation spectroscopy system to achieve a peak shape having minimum distortion including the following steps: calculating a time constant of a preamplifier output as an identified time constant, in step 70; producing a correction based upon the identified time constant, in step 72; and applying the correction to the pole-zero cancellation network, in step 74. The step of calculating a time constant of a preamplifier output as an identified time constant 70 can be accomplished in a variety of methods. One method of calculating the time constant 70 includes the steps of sampling an output of a preamplifier as a sampled output, in step 76, and calculating the identified time constant from the sampled output, in step 78. An alternate method of calculating the time constant 70 includes the step of reading a predetermined value from a memory, in step 82, the predetermined value representing the time constant of the preamplifier. Finally, the step of producing a correction based upon the identified time constant 72 includes the step of selecting a correction based upon the identified time constant from a set of correction data stored in a look-up table, in step 80.

Although specific features of the invention are shown in some drawings and not others, this is for convenience only as each feature may be combined with any or all of the other features in accordance with the invention.

While a preferred embodiment has been shown and described, it will be understood that it is not intended to limit the disclosure, but rather it is intended to cover all modifications and alternate methods falling within the spirit and the scope of the invention as defined in the appended claims.

We claim:

1. An automatic pole-zero adjustment circuit for an ionizing radiation spectroscopy system, said automatic pole-zero adjustment circuit comprising:

a detector unit including a radiation detector in electrical communication with a preamplifier responsive to random analog pulses, said preamplifier producing a preamplifier output having a characteristic time constant;

a high pass filter in electrical communication with said preamplifier, said high pass filter producing a filtered signal;

a time constant identifier in electrical communication with said detector unit, said time constant identifier producing an identified time constant based upon said characteristic time constant;

a correction generator in electrical communication with said time constant identifier, said correction generator generating a correction calculated to compensate for undershoot in said preamplifier output, said correction derived from said identified time constant; and a pole-zero adjustment network in electrical communication with said correction generator, said pole-zero adjustment network applying said correction such that said filtered signal is pole-zero canceled.

2. The automatic pole-zero adjustment circuit of claim 1 wherein said time constant identifier includes a sampling analog-to-digital converter in electrical communication with said preamplifier, said sampling analog-to-digital converter sampling said preampiffier output and producing a sampled output.

3. The automatic pole-zero adjustment circuit of claim 2 wherein said time constant identifier includes a processing device in electrical communication with said sampling analog-to-digital converter, said processing device calculating said identified time constant based upon said sampled output.

4. The automatic pole-zero adjustment circuit of claim 1 wherein said time constant identifier is a memory device in electrical communication with a processing device, said memory device storing data representing said characteristic time constant which is read by said processing device.

5. The automatic pole-zero adjustment circuit of claim 4 wherein said correction generator selects a correction based upon said identified time constant from a set of correction data stored in a look-up table.

6. The automatic pole-zero adjustment circuit of claim 1 wherein said correction is a digital correction signal representing an analog cancellation current, said pole-zero adjustment network being in electrical communication with said high pass filter and including a digital-to-analog converter for converting said digital correction signal to an analog correction signal which is summed with said filtered signal.

7. The automatic pole-zero adjustment circuit of claim 1 wherein said pole-zero adjustment network is a programmable digital shaping filter.

8. A method of automatically adjusting a pole-zero adjustment circuit of an ionizing radiation spectroscopy system to achieve a peak shape having a minimum distortion, said method comprising the steps of:

(a) calculating a time constant of a preamplifier output as an identified time constant;

(b) generating a correction calculated to compensate for undershoot in said preamplifier output, said correction derived from said identified time constant; and (c) applying said correction to the pole-zero adjustment circuit such that a distortion in each peak shape is minimized.

9. The method of claim 8 wherein said step of calculating a time constant of a preamplifier output further includes the steps of:

(d) sampling an output of a preamplifier as a sampled output; and (e) calculating said identified time constant from said sampled output.

10. The method of claim 8 wherein said step of calculating a correction based upon said identified time constant further includes the step of selecting a correction based upon said identified time constant from a set of correction data stored in a look-up table.

11. The method of claim 8 wherein said step of calculating a time constant of a preamplifier output further includes the step of reading a predetermined value from a memory, said predetermined value representing said time constant of said preamplifier output.

12. An automatic pole-zero adjustment circuit for an ionizing radiation spectroscopy system comprising:

a detector means including a radiation detector in electrical communication with a preamplifier means responsive to random analog pulses and producing an output having a characteristic time constant;

a high pass filter means for removing low frequency signals from said preamplifier means output and producing a filtered signal;

a time constant identification means for identifying said characteristic time constant as an identified time constant;

a correction generation means for generating a correction calculated to compensate for undershoot in said preamplifier means output, said correction derived from said identified time constant; and a pole-zero adjustment means for applying said correction such that said filtered signal is pole-zero cancelled.

13. The automatic pole-zero adjustment circuit of claim 12 wherein said time constant identification means includes a sampling analog-to-digital converter means in electrical communication with said preamplifier means for sampling said preamplifier means output as a sampled output.

14. The automatic pole-zero adjustment circuit of claim 13 wherein said time constant identification means includes a processing means for calculating said characteristic time constant based upon said sampled output.

15. The automatic pole-zero adjustment circuit of claim 14 wherein said correction generation means selects a correction from a set of correction data stored in a look-up table means.

16. The automatic pole-zero adjustment circuit of claim 12 wherein said detector means includes a memory means for storing data representing said characteristic time constant and said time constant identification means reads said data.

17. The automatic pole-zero adjustment circuit of claim 12 wherein said correction is a digital correction signal representing an analog cancellation current, said pole-zero adjustment means including a digital-to-analog conversion means for converting said digital correction signal to an analog correction signal which is summed with said filtered signal.

18. The automatic pole-zero adjustment circuit of claim 12 wherein said pole-zero adjustment means is a programmable digital shaping filter means.

* * * * *